United States Patent [19]

Takagi et al.

[11] Patent Number: 5,550,400

[45] Date of Patent: Aug. 27, 1996

[54] SEMICONDUCTOR DEVICE EQUIPPED WITH ANTIFUSE ELEMENTS AND A METHOD FOR MANUFACTURING AN FPGA

[75] Inventors: Mariko Takagi; Ichiro Yoshii, both of Kawasaki; Kaoru Hama; Naoki Ikeda, both of Yokohama; Hiroaki Yasuda, Zushi, all of Japan

[73] Assignee: Kabushiki Kaisha Toshiba, Tokyo, Japan

[21] Appl. No.: 270,458

[22] Filed: Jul. 5, 1994

[30] Foreign Application Priority Data

Jul. 5, 1993 [JP] Japan .................................. 5-190949

[51] Int. Cl.⁶ .................................................. H01L 29/00
[52] U.S. Cl. ............................................ 257/530; 437/922
[58] Field of Search ............................. 257/530; 437/922

[56] References Cited

U.S. PATENT DOCUMENTS

| 4,751,197 | 6/1988 | Wills | 257/530 |
|---|---|---|---|
| 4,876,220 | 10/1989 | Mohsen et al. | |
| 5,070,384 | 12/1991 | McCollum et al. | 257/530 |
| 5,100,827 | 3/1992 | Lytle | |
| 5,166,556 | 11/1992 | Hsu et al. | |
| 5,304,508 | 4/1994 | Cohen | 257/530 |
| 5,308,795 | 5/1994 | Hawley et al. | 257/530 |
| 5,449,947 | 9/1995 | Chen et al. | 257/530 |
| 5,486,707 | 1/1996 | Look et al. | 257/530 |

FOREIGN PATENT DOCUMENTS 448141  2/1991  European Pat. Off. .

OTHER PUBLICATIONS

European Search Report dated Oct. 10, 1995, Appl. No. 95101422.4.

Takagi, M. T., et al., "International Electron Devices Meeting", Dec. 5–8, 1993, Washington, D.C. p. 31.

Savvides, N., "Effects of Hydrogenation and doping on the Conductivity and density of defect States Amorphous Silicon", pp. 2788–2792. *Journal Applied Physics* 56(10) 15 Nov. 1984.

*Primary Examiner*—J. Carroll
*Attorney, Agent, or Firm*—Loeb & Loeb LLP

[57] ABSTRACT

A semiconductor device is provided having the following arrangement. A first electrode is formed on the major surface of a semiconductor substrate and comprises a first Al connection layer formed over the semiconductor substrate and a barrier metal layer provided on, and electrically connected to, the first Al connection layer and serving as a barrier against the Al. An insulating film is formed over the semiconductor substrate so as to cover the first electrode. An opening is formed in the insulating film so as to partially expose the first electrode. An antifuse film is formed in a manner to partially cover the insulating film and contact with the barrier metal layer of the first electrode with the opening therebetween. The antifuse film is formed of silicon nitride whose nitrogen/silicon atomic composition ratio ranges from 0.6 to 1.2. A second electrode is formed over the antifuse film and comprised of a barrier metal layer serving as a barrier against the Al.

2 Claims, 8 Drawing Sheets

SEMICONDUCTOR DEVICE EQUIPPED WITH ANTIFUSE ELEMENTS AND A METHOD FOR MANUFACTURING AN FPGA

BACKGROUND OF THE INVENTION

1. Field of the Invention

The present invention relates to a semiconductor device equipped with antifuse elements for use, for example, in an FPGA (Field Programmable Gate Array) and a method for the manufacturing the same.

2. Description of the Related Art

An antifuse element comprises a pair of conductors and a high resistive body or insulator inserted between these conductors. The antifuse element is of such an electrically programmable type that it reveals an insulating or high resistive property in an initial state (a non-programmed state) and a low resistive or conducting state in a programmed state (after the application of a predetermined voltage). The antifuse element is used in a conventional PROM, such as a fuse ROM, and, in recent years, in an FPGA, one kind of a gate array.

The gate array has the feature that it is capable of developing a desired LSI for a brief period of time by initially manufacturing a chip with basic cells arranged and making electrical connection. Since, conventionally, the electrical connection layout is prepared using, as a mask, an electrical connection pattern formed based on a computer-aided designing (CAD), there is a tendency that less number of electrical connections leads to a greater mask manufacturing cost per chip. Under this situation, a gate array called a "FPGA" has been developed, in recent years, which can make electrical connection without the need of the user's preparing a mask. In order that, for FPGA, a plurality of basic cells may be properly joined on the side of a manufacturer, two connection layer groups are arranged in a grid-like array with an insulating film placed therebetween and an opening is provided, at each grid intersection, in the insulating interlayer in which case a thin insulating film is interposed at the opening between the connection layers.

When a normal operation voltage is applied, the thin insulating film is not conducting. When, on the other hand, a voltage exceeding a predetermined level is applied, an irreversible dielectric breakdown occurs, thus causing the upper and lower connection layers to be conducted. In the semiconductor chip a device is provided which applies a predetermined voltage to the insulating film at any given intersection point. The manufacturer sells such a semiconductor chip as a packaged product. On the other hand, the user makes proper electrical connections between the two connection layers through the conduction of the insulating film by a device for applying a predetermined voltage. By so doing it is possible to achieve desired interconnection at desired intersections.

The insulating film interposed between the conductive layers in FPGA is insulated at a normal time and conducted at a desired time. Hence the name of the antifuse element having just the opposite property to an ordinary fuse element. The antifuse element in FPGA, being incorporated into a logic circuit, demands such a characteristic as not to involve a fall in the operation speed of the circuit.

The antifuse element has, for example, the following requisite characteristics that (1) it is insulated or adequately high resistive in an initial state;

(2) it is conducted with the application of a desired program voltage;

(3) it, being selected at the program time, stays in a permanently adequately low resistive state after the end of the program;

(4) it, being not selected at the program time, is maintained, by a normal circuit operation voltage, in a permanently insulated or highly resistive state after the end of the program; and (5) it, being in the nonconducted state, involves a small capacitive level.

The aforementioned requisite characteristics of the antifuse element are determined based on the product specification of FPGA, such as a power supply voltage ($V_{dd}$), program voltage ($V_{pp}$), circuit speed, allowable dissipation power and long-term reliability. Further, the product of FPGA is governed based on the specification of an ordinary gate array of the same generation and determined based on the scaling rules of CMOS-LSI.

In practice, in the generation of the power supply voltage 5 V for instance, the requisite characteristics of the antifuse for FPGA are as follows:

(a) An antifuse element in an initial state, a resistor $P_{ini} > 1$ G$\Omega$ per element.

(b) A program voltage $V_{pp} < 20$ V (Under the present situation, $1.5 V_{dd} < V_{pp} < 3 V_{dd}$ for a normal operation voltage $V_{dd}$).

(c) For a programmed conductive antifuse, $R_{on} < 150 \Omega$ per element.

(d) For a programmed nonconductive antifuse element, a resistance $R_{off} > 1$ G$\Omega$ per element.

(e) For a nonconductive antifuse element, a capacitance $C_{off} < 3$ fF per element.

(f) At a time of a normal circuit operation, a nonconductive antifuse element maintains $R_{off}$ at an operation voltage $V_{dd}$ for 10 years.

It is very difficult in practice to realize the antifuse characteristic thus far explained. The reason for this is as will be set out below. From the standpoint of the properties of matter for instance, the insulating material film, being thicker and hence higher in its insulating property, leads to a decrease in leak current and in capacitance, while, on the other hand, the program voltage is increased and, after conduction, the resistance becomes high so that the long-term reliability of a nonconductive antifuse element is adversely affected. In view of such mutual opposite properties, it is necessary to carefully select the structure and material of the antifuse element.

Figure 1:
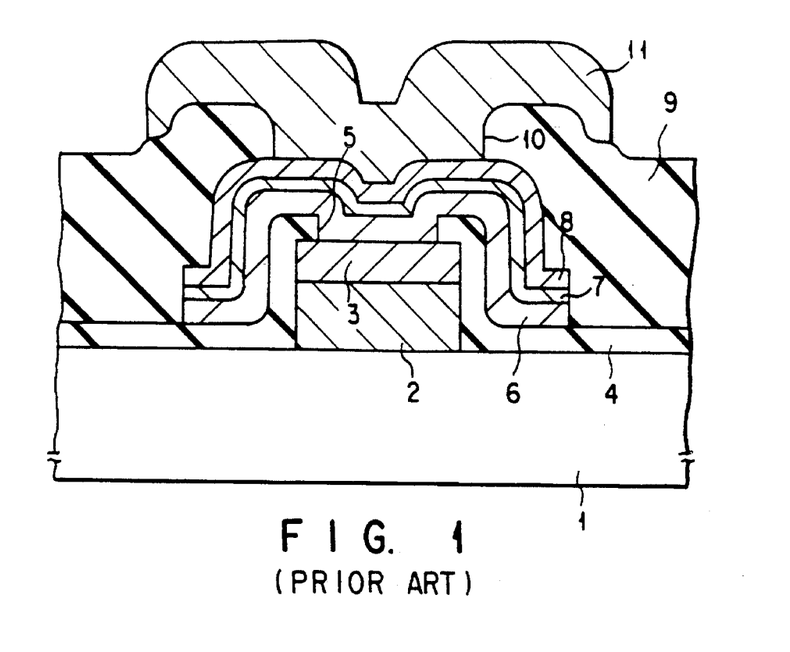
FIG. 1 is a partial cross-sectional view showing a conventional semiconductor device showing a structure interposing an antifuse element between Al connection layers.

The conventional antifuse is of such a type that a silicon oxide film, silicon nitride film or stacked layer of these is sandwiched between silicon and silicon or polysilicon and polysilicon (U.S. Pat. No. 4,876,220). In this structure, a resistance (ON resistance after conduction is made is as high as over 10000$\Omega$ and the structure above is not suitable to a low resistance-demanding FPGA. At a later time, it has been found that the ON resistance can be made low when metal is used for the upper and lower electrodes for the antifuse. A proposal has been made to use a structure where amorphous silicon is sandwiched between the upper and lower electrodes at an Al/barrier metal stack layer (U.S. Pat. No. 5,100,827). The prior art device will be explained below with reference to FIG. 1. A barrier metal layer (TiW)3 is deposited on a underlying Al connection layer 2 overlying a silicon semiconductor substrate 1 and a resultant semiconductor is patterned to provide a first electrode for an antifuse element. The reason that the electrode is formed of a laminated structure of the Al layer and barrier metal layer is because the process steps are not adversely affected due to a reaction being developed between a silicide and a amorphous silicon, that is, a high resistive material, which results from the diffusion of Al in a later heat treating step. A first insulating film 4 is deposited on the electrode comprised of the Al layer 2 and barrier metal 3. An opening 5 is provided in the first insulating film 4 to partially expose the surface of the barrier metal layer 3 of the first electrode. In order that, at a subsequent step of depositing amorphous silicon, the amorphous silicon is properly formed over the exposed opening 5, the first insulating film 4 has such a film thickness as to provide an aspect ratio of ½ relative to the opening 5. Then a non-doped amorphous silicon 6 is deposited as a high resistive layer material on the resultant structure and patterning is effected, leaving the amorphous silicon only over the opening 5. In order to make at a low resistive level a conduction area after a programmed state, a conductive layer 7 is deposited and a barrier metal 8 is formed over the conductive layer 7. A second insulating film (plasma TEOS)9 is deposited over the barrier metal layer 8 and an opening 10 is formed in the insulating film 9 at an area above the amorphous silicon 6. An overlying Al connection layer 11 is deposited over the second insulating layer 9, followed by a patterning step. In this way, in the prior art device, an antifuse is formed between the Al connection layers using amorphous silicon as a high resistive material and a high-reliable antifuse is realized.

From the standpoint of material selection, if this material and structure are used, the ON resistance can be lowered down to about 500Ω but it is not sufficient as the characteristic of the antifuse for FPGA. There is a possibility that, if the amorphous silicon layer is made thinner, the ON resistance will be made lower. However, a new problem arises from the fact that, if the layer above is thinned, the resistance of the antifuse at a nonconductive time is lowered. Another problem with the antifuse using the amorphous silicon as the insulating layer is that the resistivity greatly varies depending upon the amount of hydrogen or other impurities (N. Savvides, J. Appl. Phys., 56, 2789, 1984). If, for example, the amount of hydrogen varies form 0% to 10%, the resistivity varies by six orders of magnitude and the film thickness satisfying the aforementioned characteristic (a) will vary from 1 nm to 1000 nm. In a practical process, hydrogen enters the amorphous silicon upon deposition of the insulating interlayer, for example, at low temperature, or at a post-process such as sintering, but it is difficult to control the amount of hydrogen actually entering the amorphous silicon and hence difficult to, if the amorphous silicon is used, prepare an antifuse element with the OFF resistance (characteristic (a)) stabilized.

As another prior art technique using metal for the upper and lower electrodes as disclosed, for example, U.S. Pat. No. 5,166,556, a proposal has been made to provide a structure where an insulating material, such as silicon nitride (SiNx), 0<x<1.4), is sandwiched between high melting point metal (titanium) layers. According to this technique, if a 30 nm–400 nm-thick nonstoichiometric amorphous silicon-based insulating layer is used, it is indicated that, with a 100MΩ OFF resistance and program voltage scalable from 3 V to 40 V, it is possible to provide an antifuse having an ON resistance of about 100Ω. The technique above has the feature that the antifuse characteristic, such as the program voltage, is scalable or adjustable. This is realized by depositing the antifuse layer (insulating layer) on the surface by means of a plasma CVD method and varying the gas flow ratio. As known in the prior art, if the gas flow ratio is varied, the composition ratio of the insulating film to be deposited and hence the properties of matter vary. Taking this fact into consideration, the technique above is applied to the antifuse. (1) Since, according to the technique, not only the titanium but also other high melting point metals are used for upper and lower electrodes and connection layers, it is not possible to realize the circuit speed based on an ordinary CMOS-LSI using Al connection layers. (2) Although the composition of the nonstoichiometric silicon nitride (SiNx) is in a range 0<x<1.4 (this is an area all covered from the amorphous silicon to the stoichiometric silicon nitride $Si_3N_4$), all the requisite characteristics (a) to (f) of the antifuse for FPGA are not satisfied over a whole composition range of 0<x≦1.4 from the standpoint of the dependence of various properties of matter of the silicon nitride (SiNx) upon its composition ratio (referring to a later description or see M. Takagi et. al, IEDM Technical Digest (1993)). In the case where Al is used for the electrodes and connection layers so as to realize a CMOS-LSI-based circuit speed, (3) if a higher energy is produced at the antifuse at the program time the Al connection layer is melted/broken and the selective range of the antifuse material becomes stricter than in the case where the high melting point metal is used for the connection layers and electrodes. It is not possible to prepare an antifuse, for FPGA, over the whole composition range of 0<x<1.4. In the prior art manufacturing method above, it becomes difficult to control the thickness of the antifuse's insulating film at the bottom surface corner of bias from the standpoint of the problem with the step coverage of the antifuse film. It is, therefore, not possible to properly control the program voltage and OFF leak current.

In the prior art arrangement, a high-reliable antifuse element is achieved by providing the barrier metal layer 3 on the Al connection layer 2 and defining, for example, the aspect ratio of the opening where the amorphous silicon is deposited. According to the present invention, the ON resistance can be lowered to about 500Ω. Judging from the overall point of view including a consideration on the process of antifuse element for FPGA, however, it may be said that neither the material selection nor the structural designing of the antifuse element is properly made at all times. Although the amorphous silicon is selected as an insulating material or high resistive material, it is known that the resistivity of the amorphous silicon varies depending upon the content of hydrogen or other impurities (N. Savvides, J. Appl. Phys., 56, 2789, 1984). If the content of hydrogen varies, for example, from 0% to 10%, the resistivity of the amorphous silicon varies by six orders of magnitude and it is, therefore, necessary that, in order to satisfy the aforementioned characteristic (a), the thickness of the film involved be varied from a few nm to several 1000 nm. In a practical process, there occurs a deposit of an insulating interlayer ($SiO_2$) at low temperature and, in addition, hydrogen is incorporated into the amorphous silicon at a later step, such as a sintering step, but the amount of hydrogen involved is difficult to control. Therefore, it has been much more difficult to form a stabler antifuse element against the characteristic (a) above than to use the amorphous silicon.

If Al is used as the electrode from the standpoint of the process, Al is diffused into the antifuse material and, further, an Al hillock occurs at a later heating step, thus posing the problem that the hillock pierces through the antifuse material. If this is the case, then the antifuse element suffers an initial failure or a drop in breakdown voltage. In order to provide proper deposition of an amorphous silicon, the aspect ratio of the opening at an antifuse formation area is so designed as to be below ½. Even according to the present invention, however, it is unavoidable that an amorphous film becomes thinner at the edge of the opening. It is, therefore, not possible to expect much from this method. Further, in the real manufacture of an FPGA product, an antifuse process is incorporated into a conventional gate array process. From this viewpoint, the prior art device requires ample room for improvement. In an arrangement of an antifuse element provided between the Al connection layers and its manufacturing process, problems arise when this element or process is compatibly applied to the conventional process for practical application to an FPGA or when a stabler element is to be manufactured. To be specific, tasks to be solved are to obtain an antifuse film stable to the process, to prevent occurrence of a hillock in the Al connection layer, to obtain a structure whereby an antifuse film can be properly deposited, to provide vias from a standpoint of process integration, etc.

SUMMARY OF THE INVENTION

In the view of the prior art problems encountered, an object of the present invention is to provide an antifuse element which, in order to achieve a CMOS-LSI-based circuit performance, uses Al connection layers and electrodes and an insulating layer of a silicon nitride-based antifuse.

Another object of the present invention is to provide an antifuse element which is compatible with a CMOS-LSI process and has a program voltage, OFF resistance, ON resistance and capacitance corresponding to respective CMOS generations.

According to the present invention there is provided a semiconductor device comprising:

a semiconductor substrate;

a first electrode formed over the semiconductor substrate and comprised of an Al connection layer formed over the semiconductor substrate and a barrier metal layer provided on, and electrically connected to, the Al connection layer;

an antifuse film formed on and in contact with the first electrode and formed of silicon nitride whose nitrogen/silicon atomic composition (N/Si) ratio ranges from 0.6 to 1.2; and a second electrode formed on the antifuse film and electrically connectable to the first electrode with the antifuse film formed therebetween, and comprised of the barrier metal layer serving as a barrier against the Al.

Another object of the present invention is to provide a manufacturing method which can realize an antifuse characteristics in a well-controlled way.

According to the present invention, there is provided a method for manufacturing a semiconductor device comprising the steps of:

forming a first electrode over a major surface of a semiconductor substrate, the first electrode being comprised of an Al connection layer formed over the semiconductor substrate and a barrier metal layer provided on the Al connection layer and serving as a barrier against the Al;

forming an insulating film over the semiconductor substrate so as to cover the first electrode;

forming an opening in the insulating film so as to partially expose the first electrode;

forming an antifuse film, by a plasma CVD method, in a manner to partly cover the insulating film and contact with the barrier metal layer of the first electrode via the opening, the antifuse film being formed of silicon nitride whose nitrogen/silicon atomic composition ratio (N/Si) ranges from 0.6 to 1.2; and forming a second electrode on the antifuse film, the second electrode being formed of a barrier metal layer serving as a barrier against the Al.

In view of the aforementioned structure, the semiconductor device of the present invention is characterized in that the silicon nitride is a high selective material of practical applicability to the antifuse element for FPGA because the silicon nitride reveals a high resistivity in spite of its dielectric constant being nearer to the ordinary silicon nitride and because its breakdown field ranges from a low value nearer to the amorphous silicon to a high value nearer to a stoichiometric silicon nitride. Further, since the antifuse element of the present invention uses the barrier metal layer for the electrode which serves as a barrier against Al, it is possible to initially prevent occurrence of hillocks in the Al connection layer. An insulating interlayer has a tapered opening where an antifuse film is provided between the Al connection layers. This specific structure provides a stable antifuse element with an improved step coverage.

In view of the aforementioned arrangement, it is possible, according to the manufacturing method of the present invention, to manufacture an antifuse element-equipped semiconductor device in a stable manufacturing process which satisfies the requisite characteristics of the antifuse element.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE PREFERRED EMBODIMENTS

Embodiments of the present invention will be explained below with reference to the accompanying drawings.

Figure 2:
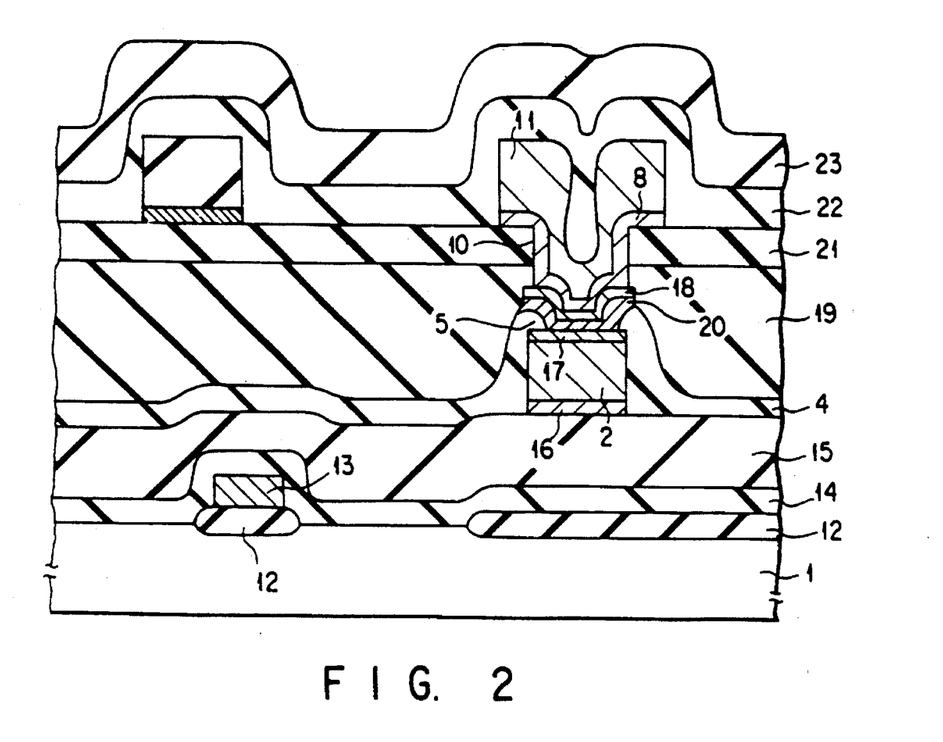
FIG. 2 is a partial cross-sectional view showing an antifuse element-equipped semiconductor device according to a first embodiment of the present invention.

First, a first embodiment of the present invention will be explained below with reference to FIG. 2. FIG. 2 is a cross-sectional view showing an antifuse element provided between Al connection layers formed on a semiconductor substrate of an FPGA type semiconductor device. An about 400 nm-thick field oxide film 12 is provided on a major surface of the semiconductor substrate 1. Further, an about 400 nm-thick polysilicon connection layer 13 is formed over the semiconductor substrate 1, for example, on the field oxide film 12 such that it is continuously connected to a polysilicon gate, not shown, for an element formed in the semiconductor substrate 1. An about 300 nm-thick $SiO_2$ insulating film 14, including the polysilicon connection layer 13, is deposited by a CVD (chemical vapor deposition) method, etc., over the semiconductor substrate 1. An about 1000 nm-thick BPSG (Borophospho-Silicate Glass) insulating film 15 is formed on the resultant structure and an about 800 nm-thick first Al connection layer 2 is provided on an underlying layer such that it is electrically connected to the polysilicon connection layer 13.

An about 20/70 nm-thick Ti/TiN barrier metal layer 16, for example, is provided as the underlying layer for the first Al connection layer 2. An about 20/70 nm-thick Ti/TiN barrier metal layer 17 is formed on the first Al connection layer 2 and, together with the first Al connection layer 2, provides a first electrode for the antifuse element. In order to cover the first Al connection layer 2 and barrier metal layer 17, an $SiO_2$ insulating film 4 of a TEOS film is formed on the BPSG insulating film 15. A predetermined portion of the insulating film 4 is selectively etched to provide an opening 5 where the surface of the barrier metal layer 17 is exposed. An antifuse film 20, that is, a silicon nitride film having an atomic composition ratio (N/Si) of 0.6 to 1.2, is formed on the barrier metal layer 17 and insulating film 4 at the opening 5 area. An about 20/70 nm-thick Ti/TiN barrier metal layer 18 is provided over the resultant structure. In order to partially cover the barrier metal layer 18, an $SiO_2$ insulating film 19 of, for example, a TEOS film is deposited on the insulating film 4. The insulating film 19 is planarized and an about 500 nm-thick $SiO_2$ insulating film 21 of a TEOS film is formed over the insulating film 19. The insulating films 19 and 21 are selectively etched at their predetermined areas to provide an opening 10 where the barrier metal layer 18 is exposed.

An about 20/70 nm-thick Ti/TiN metal layer 8 is formed on a portion of the insulating film 21, on a side wall of the opening 10 in the insulating films 19, 21 and on the exposed surface of the barrier metal layer 18 at the opening 10. An about 1000 nm-thick second Al connection layer 11 is formed over the barrier metal layer 8 serving as an underlying layer. The barrier metal layers 8 and 18 are formed as a laminated structure and, together with the second Al connection layer 11, provide a second electrode for the antifuse element. In order to cover the second Al connection layer 11, an about 500 nm-thick $SiO_2$ insulating film 22 is formed, as a TEOS film, on the semiconductor structure and an $Si_3N_4$ insulating film 23 is deposited by a plasma CVD method, etc., on the resultant structure so that the surface of the semiconductor structure is stabilized.

As shown in FIG. 2, the opening 5 in the insulating film 4 is so tapered that the top side of the opening has a size larger than the size of the bottom side of the opening, noting that the sizes of the top and bottom sides of the opening 5 are, for example, 1 to 2 μm and about 0.8 μm, respectively. If the inner wall of the opening 5 is formed vertically, a silicon nitride film serving as the antifuse film is not formed uniformly on the inner wall of the opening 5, thus producing some thinner area. From this viewpoint, the opening 5 is tapered to provide an inclined inner wall. In this way it is possible to uniformly form the antifuse film on the inner wall of the opening 5. In order to cover a portion of the barrier metal layer 18 the $SiO_2$ insulating film 19 is deposited on the insulating film 4 and the resultant structure is planarized. The $SiO_2$ insulating film 19 is provided on the planarized surface. The insulating films 19, 21 are selectively etched at their predetermined area to provide the opening 10 where the surface of the barrier metal layer 18 is exposed.

Figure 3:
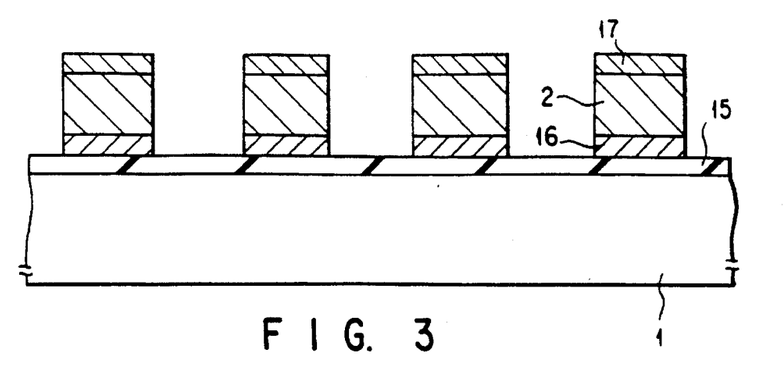
FIG. 3 is a partial cross-sectional view showing one step of manufacturing an antifuse element-equipped semiconductor device according to a second embodiment of the present invention.
Figure 4:
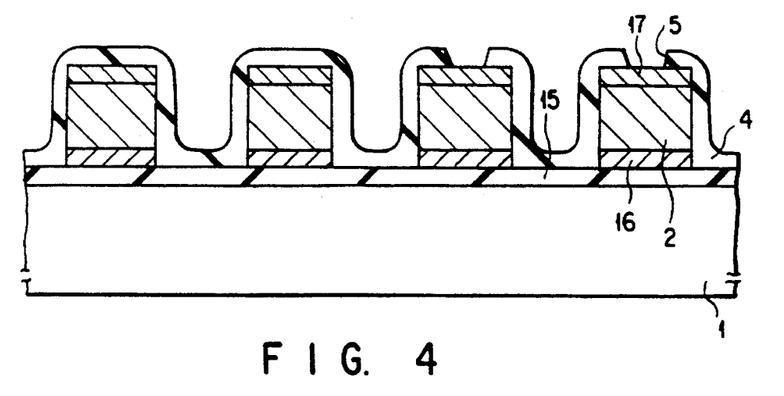
FIG. 4 is a partial cross-sectional view showing a subsequent step of manufacturing an antifuse element-equipped semiconductor device above.
Figure 5:
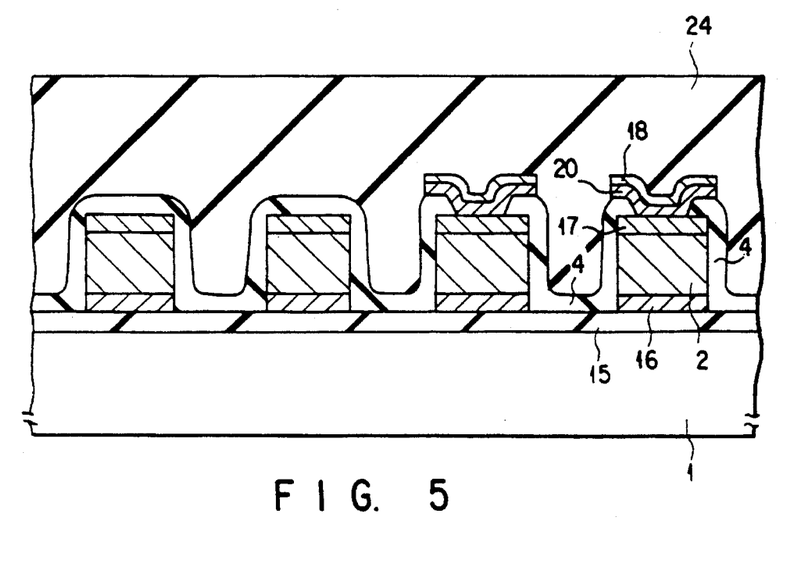
FIG. 5 is a partial cross-sectional view showing a subsequent step of manufacturing an antifuse element-equipped semiconductor device above.
Figure 6:
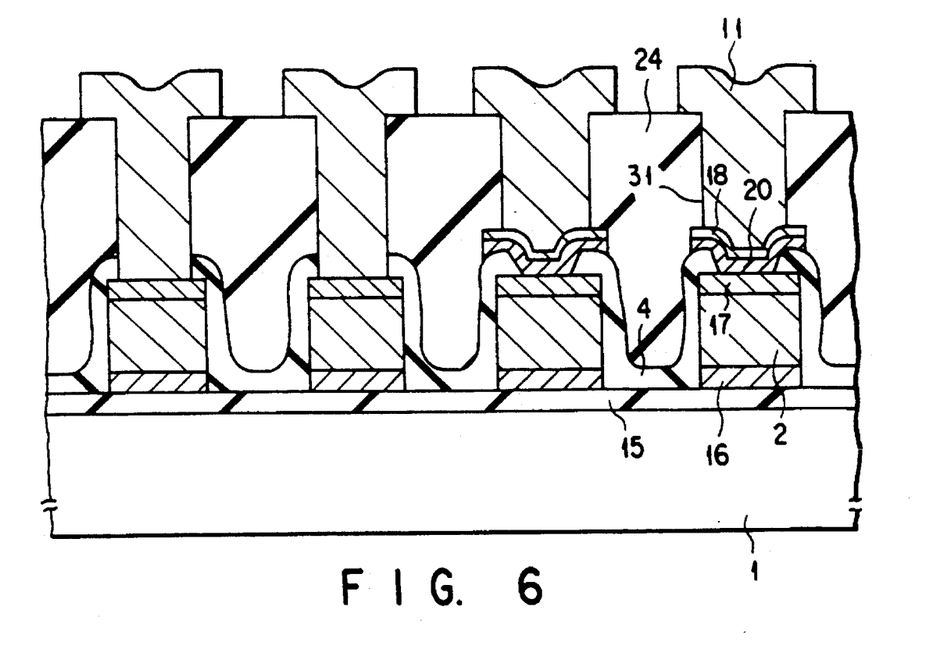
FIG. 6 is a partial cross-sectional view showing a final step of manufacturing an antifuse element-equipped semiconductor device according to the second embodiment of the present invention.
Figure 7:
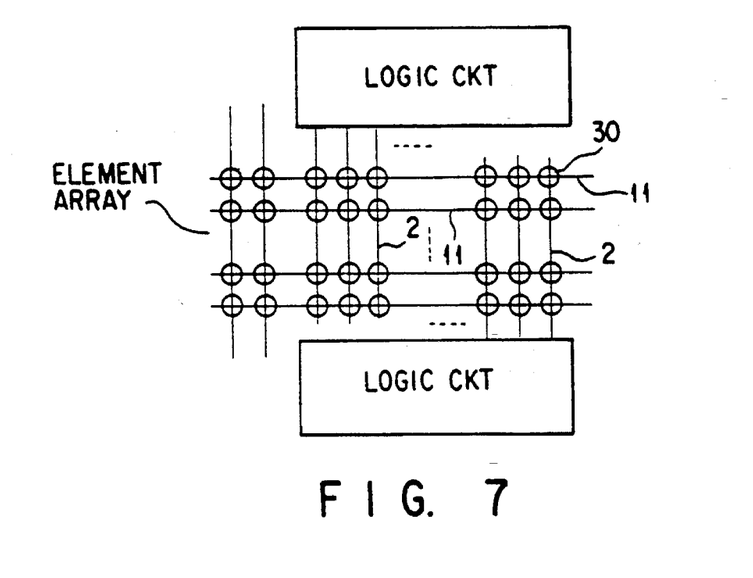
FIG. 7 is a model connection diagram showing an antifuse element-equipped semiconductor device of the present invention.

Referring to FIGS. 3 to 7, a second embodiment of the present invention will be explained below in conjunction with the manufacturing method of a semiconductor device (FPGA). FIGS. 3 to 5 are the cross-sectional views showing the steps of the manufacturing method and FIG. 6 is a cross-sectional view showing the final step of the manufacturing method for a FPGA having an insulating film structure with the tapered opening as shown in FIG. 2. FIG. 7 shows an array of antifuse (AF) elements arranged between connection layers which are in turn arranged between logic circuits in FPGA. As shown in FIG. 7, an AF element 30 is connected between connection layers 2 and 11 and programmed or blown as required. In FIG. 6 four contact points are arranged between Al connection layers 2 and 11 and AF elements 30 are shown arranged on two right-side contacts.

An about 1000 nm-thick BPSG insulating film 15 is formed on the surface of a silicon semiconductor substrate 1. A polysilicon connection layer and other insulating films formed between a surface of a field oxide film and the insulating film 15 are omitted in explanation. An about 20/70 nm-thick Ti/TiN layer is sputtered on the insulating film 15 and an about 800 nm-thick Al layer is sputtered on the resultant structure. An about 20/70 nm-thick Ti/TiN layer is sputtered on the resultant structure. With a photoresist (not shown) as a mask, the resultant laminated layer structure is etched by an RIE (Reactive Ion Etching) method to provide an underlying layer, for example, a Ti/TiN barrier metal layer 16, a first Al connection layer 2 and a barrier metal layer 17 constituting, together with the first Al connection layer 2, a first electrode for the antifuse element. As shown in FIG. 3, an about 400 nm-thick SiO$_2$ insulating film 4 is deposited by a CVD method on the surface to provide an insulating interlayer. This film 4 is a TEOS film as set out above which is formed through the thermal decomposition of an organic oxysilane (Si(OC$_2$H$_5$)$_4$). Then with a photoresist as a mask the insulating film 4, formed on the barrier metal layer 17 constituting the first electrode 17 for the antifuse element, is selectively RIE-etched to provide an opening 5. The Ti/TiN barrier metal layer 17 is not etched thin because the metal layer 17 serves to prevent an Al hillock from being developed at a later heat treating step. Etching is performed at a high selection ratio between TEOS-SiO$_2$ and Ti/TiN.

Further, a selective etching is carried out under a condition that the opening 5 is so formed as to have a tapered inner surface. Given that the bottom-side diameter of the opening 5 is, for example, 0.8 μm, the top-side diameter of the opening 5 is, properly, 1 to 2 μm as will be seen from FIG. 4. An about 20 nm-thick silicon nitride film is deposited, by a plasma CVD method for instance, over the semiconductor substrate 1, noting that the silicon nitride film has a nitrogen/silicon atomic composition ratio of $1.2 \geq N/Si \geq 0.6$. Then, an about 100 nm-thick TiN is sputtered on the surface. With a photoresist as a mask the resultant structure is patterned by an RIE etching or a chemical dry etching (CDE) and a silicon nitride film 20 and TiN barrier metal layer 18 are formed on an antifuse area as an antifuse film and second electrode, respectively. Then an SiO$_2$ insulating film, that is a TEOS film, for instance, is deposited on the resultant surface and the resultant structure is planarized by an etch-back method, etc., to provide an insulating interlayer 24 over the whole surface of the semiconductor substrate 1 as shown in FIG. 5. With a photoresist as a mask, an opening 31 is provided by an RIE etching, etc., in the insulating interlayer 24 over the second electrode 18. Then, an about 100 nm-thick layer is sputtered on the resultant structure and, with a photoresist as a mask, the surface of the structure is patterned to provide a second Al connection layer 11 as shown in FIG. 6. Thereafter an ordinary passivation step is carried out as in the previous embodiment to protect a second Al connection layer.

According to the semiconductor device of the present embodiment, use is made of a plasma CVD silicon nitride (SiNx) having such a current-voltage characteristic, breakdown voltage ($V_{bd}$), dielectric constant ($\epsilon_{AF}$) and film thickness ($d_{AF}$) as to satisfy the equations below. A FPGA is realized based on the CMOS-LSI circuit performance and process by adopting an antifuse element of a lower Al connection layer·electrode (equipped with a barrier metal)/SiNx/upper Al connection·electrode (equipped with a barrier metal) structure.

The following is a concept of how to select the antifuse material.

In FPGA, as set out above, the circuit speed, dissipation power, breakdown voltage and reliability provide an important product specification and are described as:

$$\kappa < \tau/\tau_o = (1 + N_{on}R_{on}/R_{TR})(1 + N_{off}C_{off}/CL), \quad (1)$$

$$I_{leak} < \Delta I_{leak}^{system}/N_{AF} \quad (2)$$

$$1.5\ V_{dd} + 3\sigma < \overline{V_{bd}} < 3\ V_{dd} - 3\sigma, \quad (3)$$

$$T_{bd} > 10\ \text{years} \quad (4)$$

Here, τ denotes the circuit speed compared with that of a CMOS gate array of the same generation; $R_{TR}$, a transistor resistance; $C_L$, the load capacitance of the circuit; $R_{on}$, the ON resistance of the antifuse; $C_{off}$, the capacitance of an OFF antifuse; $N_{AF}$, $N_{on}$ and $N_{off}$, the total number of antifuses of FDGA's LSI, number of ON antifuses and number of OFF antifuses, respectively; $\Delta I_{leak}^{system}$, the allowable system leak by the antifuse element on the whole LSI, $I_{leak}$, a leak current per antifuse, and $I_{bd}$, the time taken to reach a lack of reliability. Further, as the condition under which the Al connection layer is not broken when the antifuse element is programmed, $$\tfrac{1}{2} \cdot C_{AF} V_{PP}^2 \leq 2 \times 10^{-9}(J) \quad (5)$$

The above are the characteristics required of the antifuse element. On the other hand, the values of these physical properties of the insulating film have a relation:

$$V_{bd} = E_{bd} \cdot d_{AF} \quad (6)$$

$$I_{leak} \propto \exp[f(E_{dd})] = \exp[f(V_{dd}/d_{AF})], \quad (7)$$

$$C_{AF} = \epsilon_{AF}/d_{AF} \quad (8)$$

$$R_{on} \propto f(d_{AF}) \quad (9)$$

$$\ln T_{bd} \propto 1/E_{dd} = d_{AF}/V_{dd} \quad (10)$$

$$f(E_{dd}) \propto \begin{cases} -q(\phi_{AF} - \phi_M)^{3/2}/E_{dd} & (FN\text{-tunneling}) \\ \sqrt{qE_{dd}/\epsilon_{AF}} & (\text{Poole-Frenkel conduction}) \end{cases}$$

Here, $E_{bd}$ denotes the breakdown field.

Figure 15:
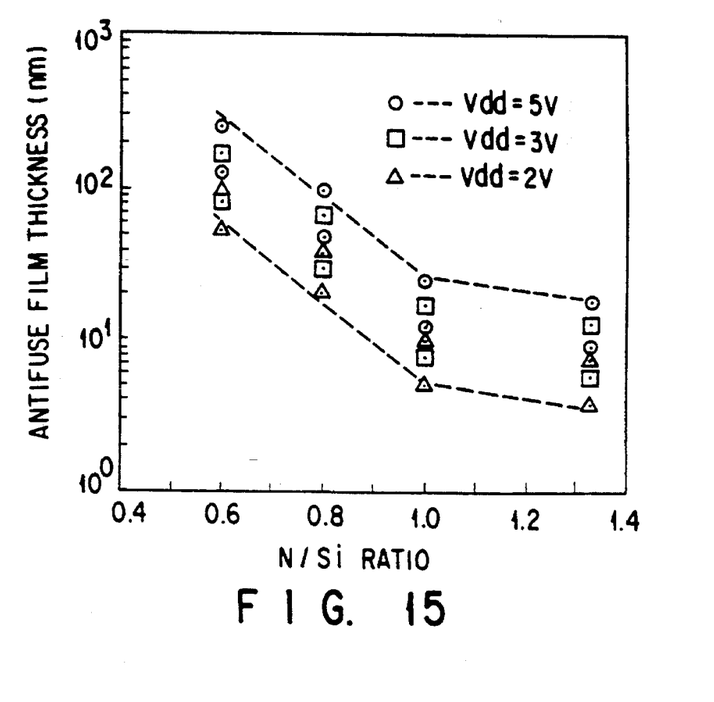
FIG. 15 is another characteristic diagram showing the antifuse film of the semiconductor device of the present invention.

In accordance with the dependence of the breakdown field upon the composition ratio, equation (6) and scaling rule of CMOS-LSI, the thickness of the antifuse satisfying the equation (3) is determined as shown in FIG. 15. For the film thickness as shown in FIG. 15, a result as shown in FIG. 15 is obtained by, with the use of FIGS. 11 and 12 and equations (6) to (10) and CMOS-LSI scaling rule, finding the antifuse characteristics at the respective composition ratio. From the equations (1) to (4) it is found suitable to use silicon nitride of an atomic composition N/Si ratio of 0.6 to 1.2 as an antifuse material whereby it is possible to realize an FPGA based on the CMOS-LSI circuit performance of the power supply generations from 5 V to 2 V shown and their processes.

Figure 8:
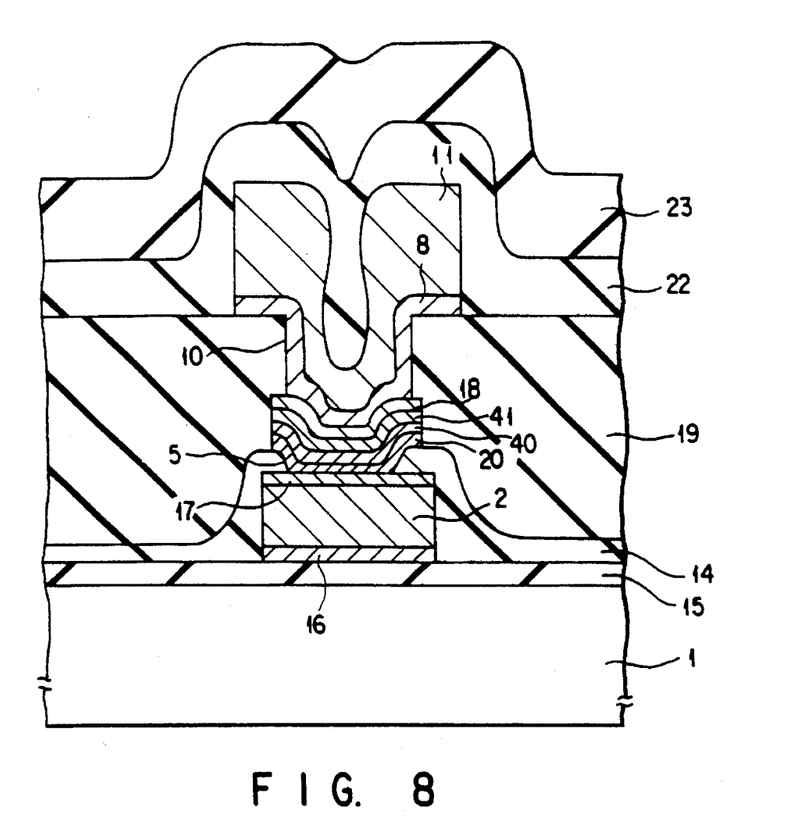
FIG. 8 is a partial cross-sectional view showing an antifuse element-equipped semiconductor device according to a third embodiment of the present invention.

A lower Al connection layer·electrode (equipped with a barrier metal)/SiNx/floating electrode/SiNx/upper Al connection layer·electrode (equipped with a barrier metal) structure as shown in FIG. 8 is realized, under the aforementioned conditions, an antifuse element with the same voltage but with a lower ON resistance, lower capacitance and lower leak current.

Referring to FIG. 8 as a third embodiment of the present invention, a partial cross-sectional view of a semiconductor device is shown with an antifuse element centrally provided between FPGAs aluminum connection layers over a semiconductor substrate 1, noting that underlying polysilicon connection layer, field oxide film, etc., are omitted. A BPSG insulating film 15 is provided on the major surface of the semiconductor substrate 1. An about 800 nm-thick first Al connection layer 2 is formed over the semiconductor structure. For example, an about 20/70 nm-thick Ti/TiN barrier metal layer 16 is formed as an underlying layer relative to the first Al connection layer 2. An about 20/70 nm-thick Ti/TiN barrier metal layer 17 is provided on the first Al connection layer 2.

Figure 9:
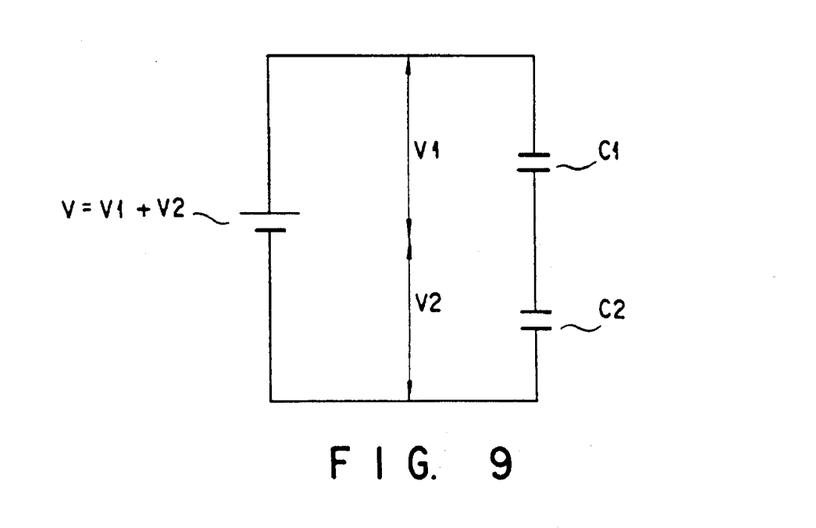
FIG. 9 shows an equivalent circuit showing the structure in FIG. 8.

The barrier metal layer 17 provides a first electrode for the antifuse element. In order to cover the first Al connection layer 2, an SiO$_2$ insulating film 14 is provided over the BPSG insulating film 15. The insulating film 14 is selectively etched at a predetermined place to provide an opening 5 where the surface of the barrier metal layer 17 is exposed. An antifuse film 20 formed of a silicon nitride film having a N/Si atomic composition ratio of 0.6 to 1.2 is formed over the barrier metal layer 17 and insulating film 14 at the opening 5. A floating electrode 40 is provided over the upper surface of the insulating film 14, side surface of the opening 5 and surface of the barrier metal layer 17. An antifuse film 41 is formed over the floating electrode 40. A 20–70 nm-thick Ti/TiN barrier metal layer 18 is formed on the surface. An about 20/70 nm-thick Ti/TiN barrier metal layer 8 is formed over the insulating film 19, side wall of an opening 10 in the insulating film 19, and the surface of the barrier metal layer 18. An about 1000 nm-thick second Al connection layer 11 is formed over the underlying barrier metal layers 8. The barrier metal layer 8, barrier metal layer 18 and second Al connection layer 11 constitute a second electrode for the antifuse element. In order to cover the second Al connection layer 11, an SiO$_2$ insulating film 22 and Si$_3$N$_4$ insulating film 23 are formed over the resultant structure for surface stabilization. As shown in FIG. 8, the opening 5 in the insulating film 14 is so tapered that the top side of the opening has a size larger than the size of the bottom side of the opening, noting that the sizes of the top and bottom sides of the opening 5 are, for example, 1 to 2 μm and about 0.8 μm, respectively. FIG. 9 shows an equivalent circuit using this structure. As evident from the equivalent circuit, two capacitances are created one in the lower Al connection layer·electrode (equipped with a barrier metal)/SiNx/floating electrode and one in the floating electrode/SiNx/upper Al connection·electrode (equipped with a barrier metal). With these two capacitances represented by C1 and C2, respectively, a voltage V applied across the upper and lower electrodes is so divided as to satisfy $$V = V_1 + V_2$$

$$C_1 V_1 = C_2 V_2$$

Further, the total capacitance C becomes $$C = \frac{C_1 C_2}{C_1 + C_2}$$

and becomes smaller. Using this construction, it is possible to vary the composition and thickness of the lower SiNx and thickness of the upper SiNx and it is, therefore, possible to widen the design latitude with which the antifuse element is designed to satisfy the equations (1) to (3). This structural topology can be made a horizontal type and the same merits can also be obtained.

Due to the step coverage of the antifuse film it has been difficult to control the thickness of the antifuse insulating film at the bottom surface corner of a via. It is also not possible to properly control the program voltage and OFF leak current. These problems are solved by providing an inverted taper in the case where the via is opened. Since the antifuse insulating film is uniformly deposited, it is possible to manufacture an antifuse element in a well-controlled way.

Figure 10:
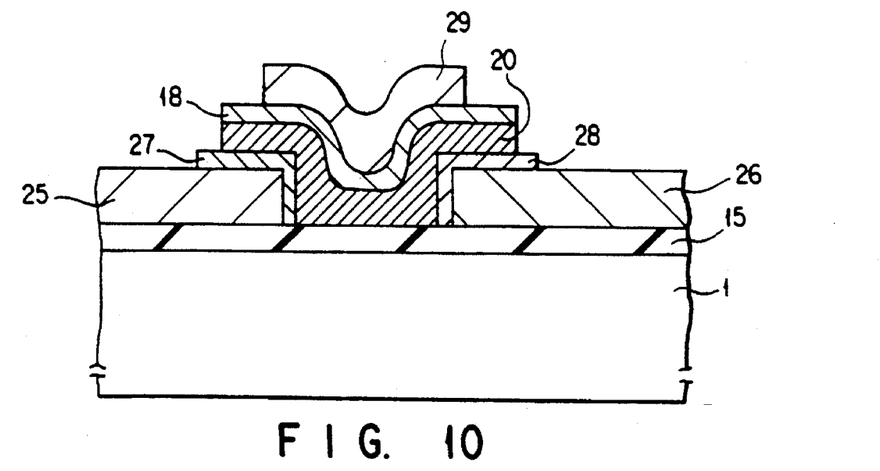
FIG. 10 is a partial cross-sectional view showing an antifuse element-equipped semiconductor device according to a fourth embodiment of the present invention.

A fourth embodiment of the present embodiment will be explained below with reference to FIG. 10. FIG. 10 is a cross-sectional view showing an FPGA including an antifuse element structure. In the previous embodiments, the antifuse element is located at a contacting point between the upper and lower connection layers, but it is also possible according to the fourth embodiment, to form two connection layers, on the same side, on an insulating film which overlies a semiconductor substrate. In the case where the antifuse element is formed, on the same plane, between the opposed connection layers, a fairly high program voltage (breakdown voltage) is required in blowing the antifuse. First and second Al connection layers 25 and 26 are so formed, at a predetermined interval, on an insulating film 15 which, in turn, is formed over a silicon semiconductor substrate 1. An antifuse layer 20 is provided at an area between the first connection layer 25 and the second connection layer 26 serving as first and second electrodes, respectively. A floating electrode 29 serving as a third electrode is provided over the antifuse film 20 with a barrier metal layer 18 interposed. By this arrangement, a program voltage is set to a desired level and, with a nonprogrammed state, the antifuse is made in a low capacitive state. Ti/TiN barrier metal layers 27 and 28 are formed over the opposed side surfaces of the Al connection layers 25 and 26 as well as those upper surface portions of the Al connection layers 25 and 26. This specific arrangement can prevent occurrence of a hillock at the Al connection layers.

A silicon nitride film 20, that is, an antifuse film having a nitrogen/silicon atomic composition ratio of $1.2 \geq N/Si \geq 0.6$, is deposited by a plasma CVD method over the first and second electrodes 27 and 28 and over the insulating film 15 between the first and second electrodes 27 and 28. Then, any proper material, such as Al and Ti, is used as a floating electrode 29 on the antifuse film 20. In the presence of the floating electrode 29 the capacitance of the antifuse element is divided into a capacitance between the floating electrode 29 and the first electrode 27 and a capacitance between the floating electrode 29 and the second electrode 28, thus ensuring a greater latitude for the program voltage and capacitance. In this embodiment, the silicon nitride film of the antifuse film material has, as will be set out below, a dielectric constant fairly lower than that of amorphous silicon, but reveals a breakdown voltage adequately smaller than a stoichiometric Si$_3$N$_4$ and, in addition, a smaller leak current. It is, therefore, possible to utilize the silicon nitride film as an ideal antifuse film.

Figure 11:
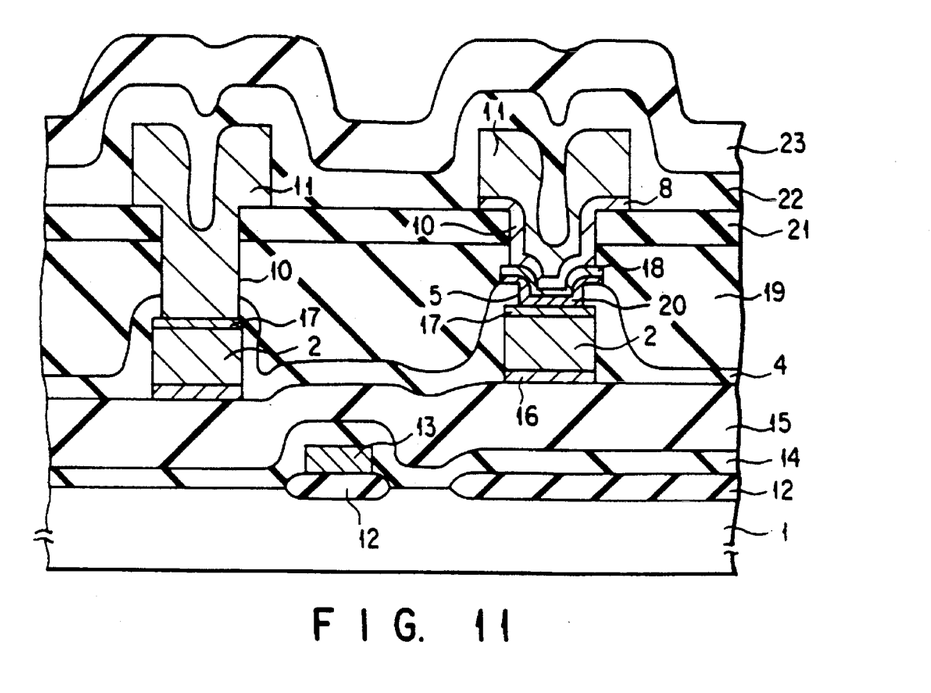
FIG. 11 is a partial cross-sectional view showing a semiconductor device according to a fifth embodiment of the present invention.

The fifth embodiment of the present invention will be explained with reference to FIG. 11. In the first embodiment, the antifuse element is interposed at the contacting area between the first and second Al connection layers 2 and 11, but the antifuse element is not arranged at every contact area between these connection layers. In the fifth embodiment, the antifuse element is not disposed on the left-side contact area. When any specific contacting area is to be formed, it is necessary to provide any opening 10 in the insulating films 19 and 21 at a specific area, but, even when the left-side contacting area is to be formed, a barrier metal layer 17 is left as it is.

The presence of the barrier metal layer 17 causes a rise in resistance of the connection layers and, in order to have a need to prevent such a resistance rise, it is necessary to remove a barrier metal layer 17 at that contacting area where no antifuse element is interposed. To this end, as a material of which the barrier metal layer 17 on a first Al connection layer 2 is formed it is only necessary to select a material whose etching rate is greater than that of a barrier metal layer 18 serving as an electrode for the antifuse element.

Figure 12:
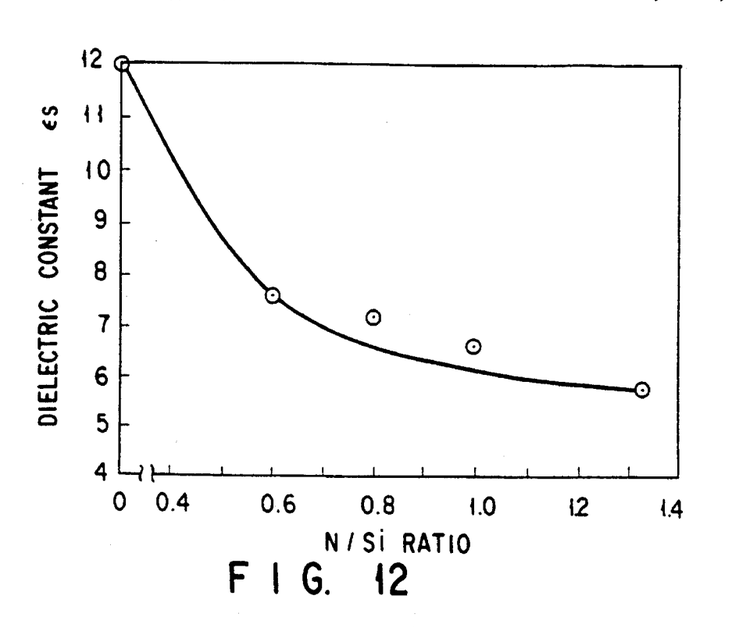
FIG. 12 is a characteristic diagram showing an antifuse film of the semiconductor device of the present invention.
Figure 13:
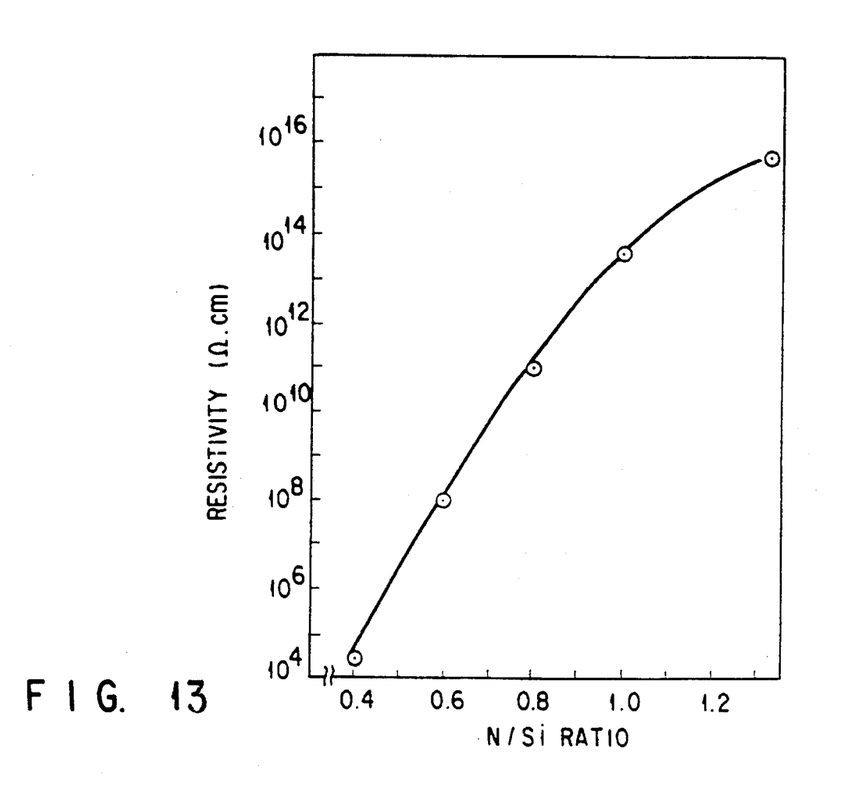
FIG. 13 is another characteristic diagram showing the antifuse film of the semiconductor device of the present invention.
Figure 14:
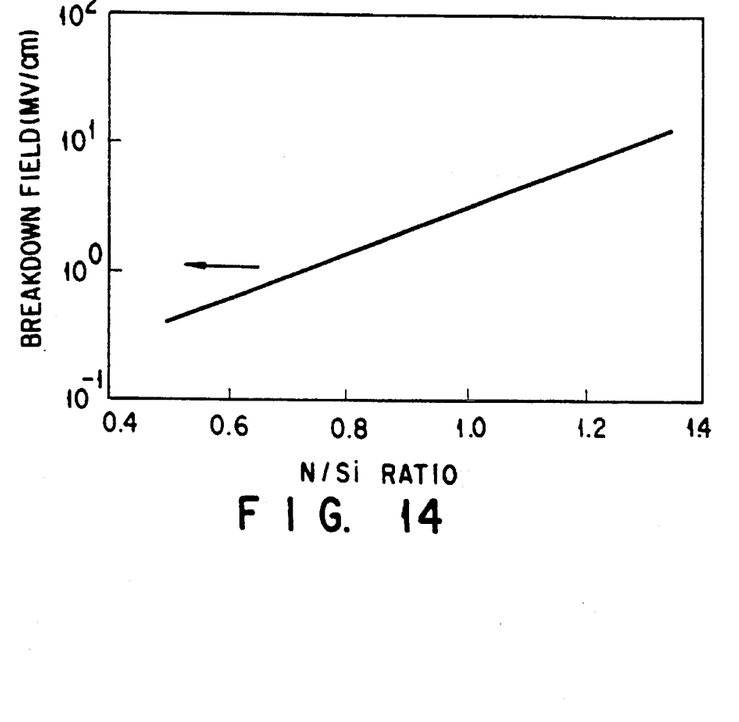
FIG. 14 is another characteristic diagram showing the antifuse film of the semiconductor device of the present invention.

The characteristics of the antifuse film material of the antifuse element for use in the semiconductor device of the present invention will be explained below with reference to FIGS. 12 to 16. FIG. 12 shows a characteristic diagram representing the dependency of a dielectric constant upon an atomic composition ratio (N/Si) of a silicon nitride film (1.2≧N/Si≧0.6) grown by a plasma CVD and serving as an antifuse film material. In FIG. 12, the ordinate denotes the dielectric constant $\epsilon_S$ and the abscissa, the N/Si ratio. FIG. 13 shows a characteristic diagram representing the dependence of a resistivity upon the atomic composition ratio (N/Si) of the silicon nitride film where the ordinate denotes a resistivity ($\Omega$ cm) and the abscissa, an N/Si ratio. FIG. 14 shows a characteristic diagram representing the dependence of a breakdown voltage upon an atomic composition ratio (N/Si) of the silicon nitride film where the ordinate denotes the intensity (MV/cm) of a program voltage (breakdown voltage) and the abscissa, the N/Si. FIG. 15 shows a characteristic diagram representing the dependence, upon the atomic composition ratio (N/Si) of the silicon nitride film, of the allowable upper and lower limits of an antifuse film thickness when respective power supply voltage $V_{dd}$ are applied. In FIG. 15 the ordinate denotes the thickness (nm) of the antifuse film and the abscissa, and N/Si ratio.

It is required that the antifuse film of the antifuse element satisfy the aforementioned characteristics (a) to (f) as the antifuse element. In the case where the antifuse element is incorporated into the semiconductor device (FPGA) as shown in FIG. 7, a transistor, not shown, for program is normally connected to the connection layers 2 and 11 relative to which the antifuse element is provided. The thickness of the gate oxide film of such a transistor is the same as those of cell transistors in a logic circuit provided in a common chip. It is, therefore, required that the breakdown field of the antifuse element be made lower than that of the gate oxide film of the transistor and greater than a test field at a time of quality assurance testing, such as a burn-in test. The breakdown field of the gate oxide film is about 10 MV/cm. For the operation voltage $V_{dd}$ for each generation the thickness $T_{ox}$ of the gate oxide film is normally scaled to $V_{dd}/T_{ox}$ ($E_{dd}$)=about 3.3 MV/cm. The test voltage is 1.5 $V_{dd}$. Hence it is required that a program voltage $V_{pp}$ applicable at the program time of the antifuse element be about 1.5 to 3 times the voltage $V_{pp}$. Since such a restriction is placed on the voltage $V_{pp}$, the thickness of the antifuse film is restricted as shown in FIG. 15, but it is possible to use an antifuse film thicker than that of the stoichiometric $Si_3N_4$. Further too great a leak current causes the characteristic of FPGA to be degraded.

Figure 16:
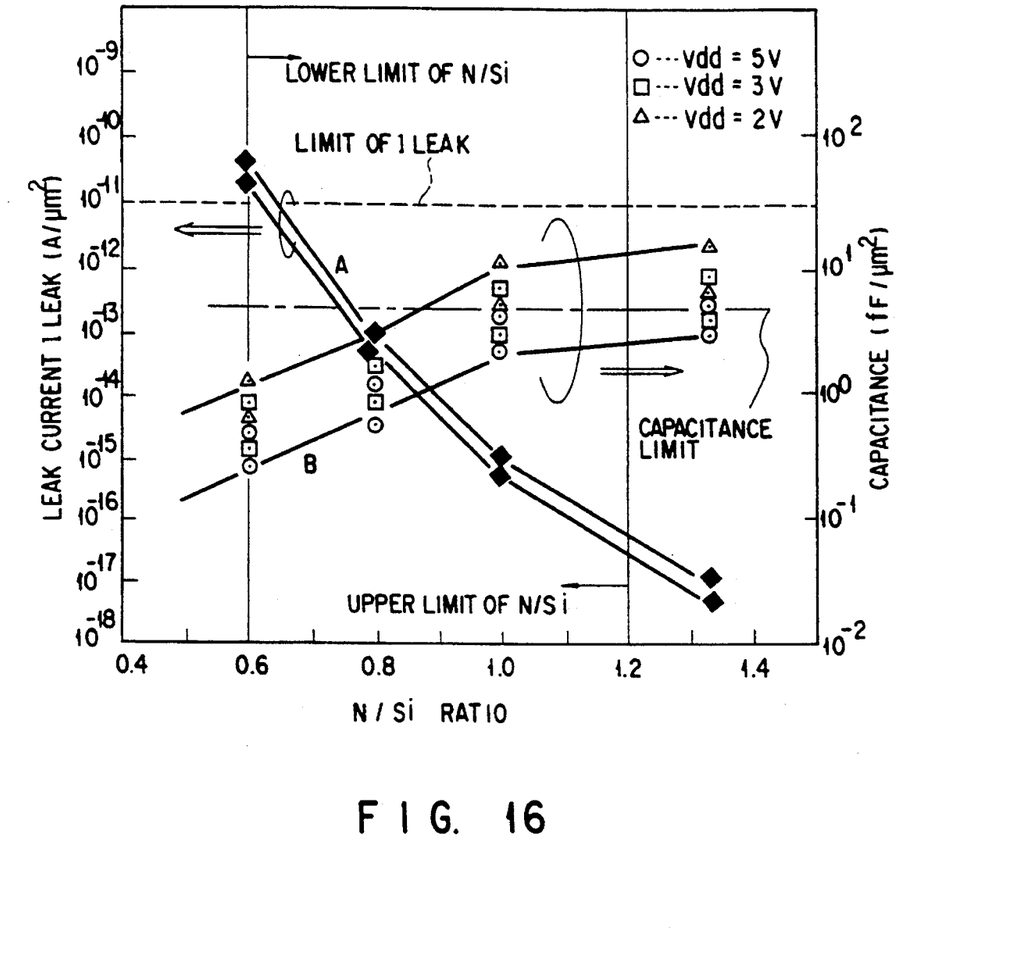
FIG. 16 is another characteristic diagram showing the antifuse film of the semiconductor device of the present invention.

For an allowable leak current ($I_{leak}$) resulting from the antifuse, 100K number of antifuse elements are realized per chip for a $V_{dd}$=5 V generation and, taking into consideration an increasing integration density based on the scaling scale, are $10^{-11}$ A/$\mu m^2$ and the allowable capacity is about 4 fF/$\mu m^2$. FIG. 16 is a characteristic diagram showing a dependence, upon the atomic ratio (N/Si) of the silicon nitride film, of the leak current and capacitance where the ordinate denotes the leak current $I_{leak}$ (A/$\mu m^2$) and capacitance (fF/$\mu m^2$) and the abscissa, the N/Si. The upper and lower limits of the N/Si ratio will be explained below with reference to the characteristic diagram. In FIG. 16, the solid lines A show leak current curves at the allowable upper and lower limits of the antifuse film thickness and, taking into consideration the allowable capacitance as set out above, the upper limit of the N/Si ratio is 1.2. Referring to FIG. 12, a decreasing N/Si ratio leads to an increasing dielectric constant, but the thickness of the antifuse film is decreasing as the N/Si ratio is increasing. Therefore, the capacitance is increasing in spite of the dielectric constant becoming smaller and hence it is not possible to increase the upper limit. Since the dielectric constant is decreased in this N/Si ratio range, it is possible to suppress an increase of the capacity to a smaller extent.

By the aforementioned condition, the antifuse film material is selected but, as the conventional typical material, amorphous silicon and stoichiometric silicon nitride ($Si_3N_4$) are known. However, the amorphous silicon exhibits a lower breakdown field, but a smaller resistivity and higher dielectric constant and has the drawbacks of slowing down the circuit speed and increasing the leak current. Further, the stoichiometric silicon nitride exhibits a greater resistivity and dielectric constant but a greater breakdown field and hence a tendency to a lower practical application. The silicon nitride of the present invention has a silicon to nitrogen ratio of between 0.6 to 1.2 and a dielectric constant of value of about 7, nearer to an ordinary silicon nitride and a higher resistivity and has a breakdown field ranging from a low value near to that of the amorphous silicon to a high value near to the stoichiometric silicon nitride. According to the present invention it is possible to obtain a high selective material of high practical applicability to the element for FPGA.

As a material for the barrier layer, that is, an electrode for the antifuse element used in the present invention, it is possible to use not only the aforementioned TiN and Ti/TiN laminated layer but also TiSi, TiW, Ti, WSi, Mo and MoSi and these laminated film.

Although, in the aforementioned embodiment, the first Al connection layer connected to the polysilicon connection layer and overlaying second Al connection layer are used as the Al connection layers with the antifuse element interposed therebetween, it is possible according to the present invention to use any proper connection layers of a multi-layered connection structure as such. In the case where a four-layered Al connection structure is used in the semiconductor device, it is possible to, for example, connect an antifuse element to the first and third Al connection layers. Further, it is also possible to connect antifuse elements to alternate layers, such as first and third layers.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A semiconductor device including an electrically programmable antifuse, the semiconductor device comprising:

a semiconductor substrate;

a first and second electrodes formed, on a same plane, over the semiconductor substrate with an insulating film interposed therebetween such that these electrodes are arranged at a predetermined interval;

an antifuse film formed on the first and second electrodes and on the insulating film and formed of a silicon nitride whose nitrogen/silicon atomic composition (N/Si) ration ranges from 0.6 to 1.2; and a floating gate formed on the antifuse film, wherein the first and second electrodes are capacitively coupled through the floating gate in such a manner that a program voltage applied between the first and second electrodes causes the antifuse to blow.

2. A semiconductor device comprising:

a semiconductor substrate;

a first electrode formed over the semiconductor substrate, the first electrode comprising a first Al connection layer formed with a first barrier metal layer therebetween and a second barrier metal layer formed over the first Al connection layer;

a first antifuse film formed on, and in contact with, the first electrode;

a first floating electrode formed over the first antifuse film;

a second antifuse film formed on the first floating electrode; and a second electrode formed over the second antifuse film, the second electrode comprising a third barrier metal layer connected to the first electrode with the second antifuse film therebetween and a second Al connection layer formed over the third barrier metal, wherein the first and second antifuse films are formed of silicon nitride whose nitrogen/silicon atomic composition ratio (N/Si) ranges from 0.6 to 1.2.

* * * * *